United States Patent
Hara (10) Patent No.: US 10,349,570 B2
(45) Date of Patent: Jul. 9, 2019

(54) COMPONENT MOUNTER

(71) Applicant: FUJI CORPORATION, Chiryu-shi (JP)

(72) Inventor: Kenji Hara, Kariya (JP)

(73) Assignee: FUJI CORPORATION, Chiryu-shi (JP)

( * ) Notice: Subject to any disclaimer, the term of this patent is extended or adjusted under 35 U.S.C. 154(b) by 257 days.

(21) Appl. No.: 15/508,521

(22) PCT Filed: Sep. 4, 2014

(86) PCT No.: PCT/JP2014/073380
§ 371 (c)(1),
(2) Date: Mar. 3, 2017

(87) PCT Pub. No.: WO2016/035195
PCT Pub. Date: Mar. 10, 2016

(65) Prior Publication Data
US 2017/0280598 A1    Sep. 28, 2017

(51) Int. Cl.
*B23P 19/00*    (2006.01)
*H05K 13/04*    (2006.01)
(Continued)

(52) U.S. Cl.
CPC ....... *H05K 13/046* (2013.01); *H05K 13/0015* (2013.01); *H05K 13/0408* (2013.01);
(Continued)

(58) Field of Classification Search
CPC ............. H05K 13/0408; H05K 13/082; H05K 13/046; H05K 13/0015; H05K 13/0417; H05K 13/08; H05K 13/0413
See application file for complete search history.

(56) References Cited

U.S. PATENT DOCUMENTS 5,035,047 A    7/1991    Harigane et al.
5,379,514 A *  1/1995    Okuda ............... H05K 13/0882
                                                            29/833
(Continued)

FOREIGN PATENT DOCUMENTS

JP    1-317000 A    12/1989
JP    2002-305398 A    10/2002
(Continued)

OTHER PUBLICATIONS

International Search Report dated Nov. 4, 2014, in PCT/JP2014/073380, filed Sep. 4, 2014.
(Continued)

*Primary Examiner* — Paul D Kim
(74) *Attorney, Agent, or Firm* — Oblon, McClelland, Maier & Neustadt, L.L.P.

(57) ABSTRACT

Control device 80 of component mounter 11 performs control such that after a component supplied by reel unit 56 is picked up by nozzle 40 of mounting head 24 and before the component is mounted on board 12, the component is temporarily placed at a specified position of temporary placement surface 71. Also, control device 80, after performing control such that the component is temporarily placed at the specified position, determines whether the component has actually been temporarily placed at the specified position based on the pressure state at a hole provided at the specified position of temporary placement surface 71 to which negative pressure is being supplied, and performs processing according to the determination result. Because the determination of whether the component has actually been temporarily placed is based on the pressure state of the hole provided in temporary placement surface 71, the determination is performed rapidly compared to a case in which the presence of the component is checked by
(Continued)

analyzing an image of temporary placement surface 71 captured from above.

6 Claims, 8 Drawing Sheets

(51) Int. Cl.
*H05K 13/00* (2006.01)
*H05K 13/08* (2006.01)

(52) U.S. Cl.
CPC ..... *H05K 13/0413* (2013.01); *H05K 13/0417* (2013.01); *H05K 13/08* (2013.01); *H05K 13/082* (2018.08); *Y10T 29/49004* (2015.01); *Y10T 29/49131* (2015.01); *Y10T 29/53191* (2015.01)

(56) References Cited

U.S. PATENT DOCUMENTS

| | | | | |
|---|---|---|---|---|
| 5,864,944 | A * | 2/1999 | Kashiwagi | H05K 13/0452 29/833 |
| 6,441,386 | B2 * | 8/2002 | Sakaguchi | H05K 13/0413 250/559.29 |
| 7,353,596 | B2 * | 4/2008 | Shida | H01L 21/67144 29/844 |
| 7,797,820 | B2 * | 9/2010 | Shida | H01L 21/67144 29/740 |
| 8,196,295 | B2 * | 6/2012 | Imafuku | H05K 13/0413 29/834 |
| 8,430,439 | B2 * | 4/2013 | Tsai | H05K 13/0409 294/64.3 |
| 2016/0120081 | A1 * | 4/2016 | Hosaka | H05K 13/0408 700/283 |

FOREIGN PATENT DOCUMENTS

| | | |
|---|---|---|
| JP | 2004-221130 A | 8/2004 |
| JP | 2005-101586 A | 4/2005 |
| JP | 2007-189142 A | 7/2007 |
| JP | 2009-140945 A | 6/2009 |
| JP | 2009-246070 A | 10/2009 |
| WO | WO 2014/087535 A1 | 6/2014 |

OTHER PUBLICATIONS

Office Action dated Jul. 10, 2018 in Japanese Patent Application No. 2016-546267 (with unedited computer generated English translation), 8 pages.

Extended European Search Report dated Aug. 4, 2017 in Patent Application No. 14901354.2.

* cited by examiner

COMPONENT MOUNTER

TECHNICAL FIELD

The present application relates to a component mounter.

BACKGROUND ART

There are known component mounters for mounting components on a circuit board that pick up a component lined up in tape or in a tray using a nozzle, move the nozzle above a board, and release the holding of the component by the nozzle at a specified position on the board to mount the component. Among this kind of component mounter, there are known mounters that, after picking up the component with the nozzle and before moving above the board, release the holding of the component at a temporary placement surface to place the component on the temporary placement surface (refer to patent literature 1). After deviation in the holding position of the component placed on the temporary placement surface has been corrected, the component is picked up again using the nozzle and moved to above the board. In patent literature 1, it is also disclosed that negative pressure supply holes are provided in the temporary placement surface. By supplying negative pressure to the negative pressure supply holes, the component placed on the temporary placement surface is fixed so as not to move on the temporary placement surface.

CITATION LIST

Patent Literature

Patent literature 1: JP-A-2004-221130

SUMMARY

However, when performing operation to place a component on the temporary placement surface by releasing the holding of the component by the nozzle above the temporary placement surface, there are cases when failure to place the component on the temporary placement surface occurs. In this case, one might consider checking for the presence of a component on the temporary placement surface by imaging after performing the above operation, but image processing takes time, meaning that time required for mounting the component increases, leading to decreased throughput (component mounting capability per unit of time).

The present disclosure solves the above problems and an object thereof is to provide a component mounter that rapidly determines whether a component has actually been temporarily placed on a temporary placement surface.

The present disclosure of a component mounter includes: a component supply device configured to supply a component; a component pickup device configured to pick up the component; a moving device configured to move the component pickup device; a board holding device configured to hold a board on which the component is to be mounted; a temporary placement surface having a hole at a specified position, the component being temporarily placed at the specified position; a pressure adjustment device configured to supply at least negative pressure to the hole; a pressure detecting device configured to detect pressure at the hole; and a control device configured to control the component pickup device and the moving device such that after the component supplied by the component supply device has been picked up by the component pickup device and before the component is mounted on the board, the component is temporarily placed at the specified position, wherein the control device, after performing control to temporarily place the component at the specified position, determines whether the component has actually been temporarily placed at the specified position based on the pressure state of the hole with negative pressure being supplied to the hole, and performs processing based on the determination result.

This component mounter performs control such that after a component supplied by the component supply device is picked up by the component pickup device and before the component held by the component pickup device is mounted on the board, the component is temporarily placed at the specified position of the temporary placement surface. Also, the component mounter, after performing control such that the component is temporarily placed at the specified position, determines whether the component has actually been temporarily placed at the specified position based on the pressure state at the hole with negative pressure being supplied to the hole, and performs processing according to the determination result. Because the determination of whether the component has actually been temporarily placed is performed based on the pressure state of the hole of the temporary placement surface, the determination is performed rapidly. Therefore, throughput is improved.

For the component mounter of the present disclosure, it is desirable that the temporary placement surface is flat. Generally when a component supply device supplies a component, the component is supplied using tape or a tray, and because the flatness of tape and trays is not good, it is easy for the component to shift. Thus, when the component pickup device picks up a component supplied by the component supply device, it is difficult to accurately pick up at a position determined in advance. However, because here the temporary placement surface is a flat surface, when picking up the component placed on the temporary placement surface again using the component pickup device, it is possible to accurately pick up at the identified position.

The present disclosure of a component mounter may further include a sideways imaging device configured to image the component picked up by the component pickup device from the side, wherein the control device, if the determination result is negative, images the component pickup device using the sideways imaging device, determines whether the component pickup device is holding the component based on the image, reports the determination result to an operator, and stops processing. Accordingly, in a case in which the component was not actually temporarily placed on the temporary placement surface, because an operator is informed whether the component is being held as is on the component pickup device, it is easy for the operator to search for the component that was not temporarily placed.

The present disclosure of a component mounter may further include a top surface imaging device configured to image the top surface of the component temporarily placed on the temporary placement surface, wherein the control device, if the determination is positive, performs processing to image the top surface of the component placed on the temporary placement surface using the top surface imaging device, identify the position of the component based on the image, control the component pickup device to pick up the component again, and control the component pickup device and the moving device such that the component is mounted on the circuit based on the identified position of the component, and, if the determination is negative, the control device stops processing. That is, after it is confirmed that the component has actually been placed at the specified position of the temporary placement surface, processing including imaging the top surface is performed. Accordingly, performing unnecessary processing in a case in which the component was not actually temporarily placed is avoided.

For the present disclosure of a component mounter, the control device may, in a case in which the component was picked up again by the component pickup device, control the pressure adjustment device such that the pressure in the hole becomes atmospheric pressure or positive surface. Accordingly, it is possible for the component pickup device to smoothly pick up the component again. This effect is particularly good when the pressure at the hole is positive pressure.

For the present disclosure of a component mounter, the control device may, after controlling the component pickup device to pick up the component again, perform a second determination of whether the component was actually picked up by the component pickup device based on the pressure state of the hole with negative pressure being supplied to the hole, and continue processing if the second determination is position, and stop processing if the second determination is positive. Accordingly, it is possible to continue processing after confirming that the component has actually been picked up from the temporary placement surface.

DESCRIPTION OF EMBODIMENTS

Figure 1:
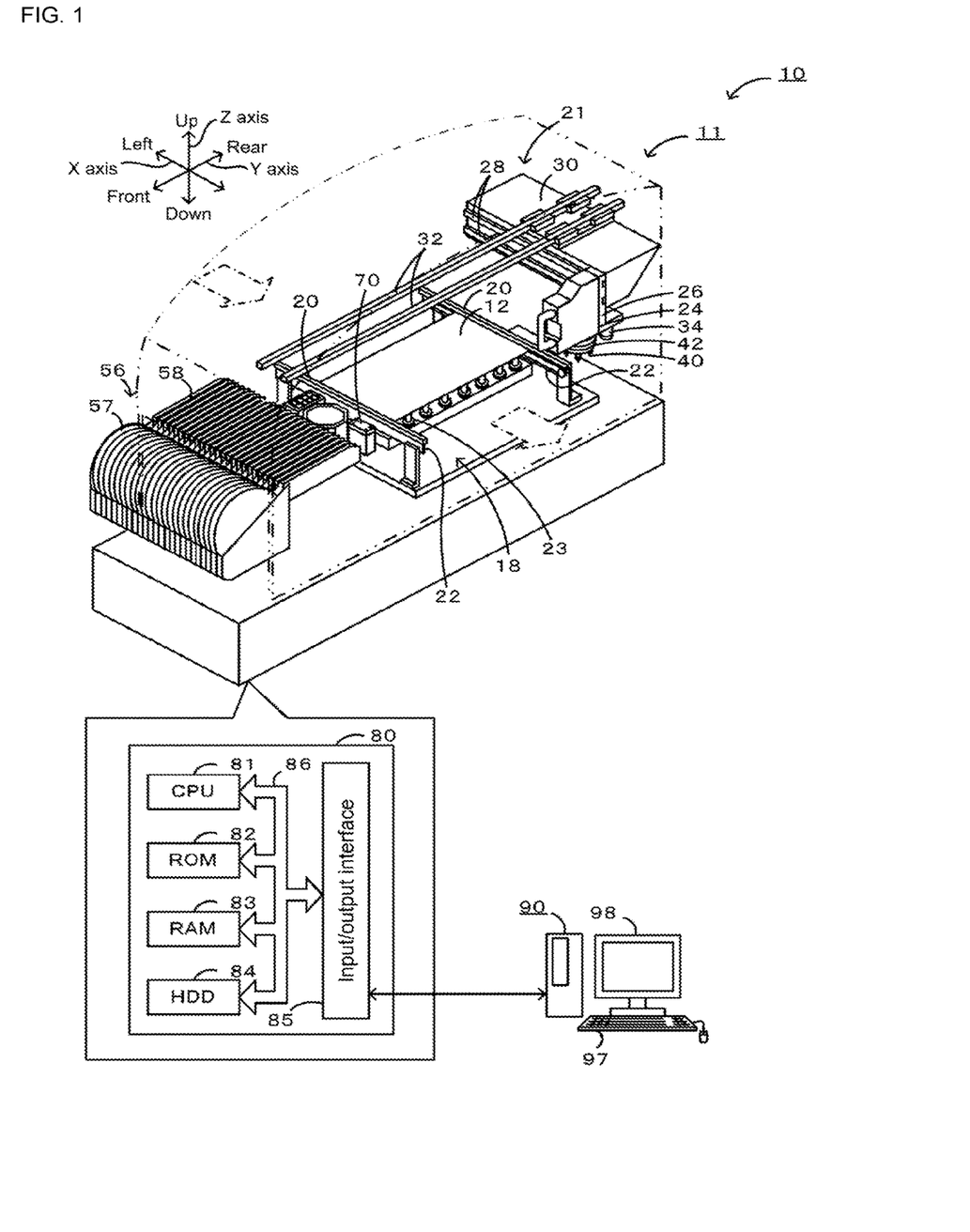
FIG. 1 shows mounting system 10.
Figure 2:
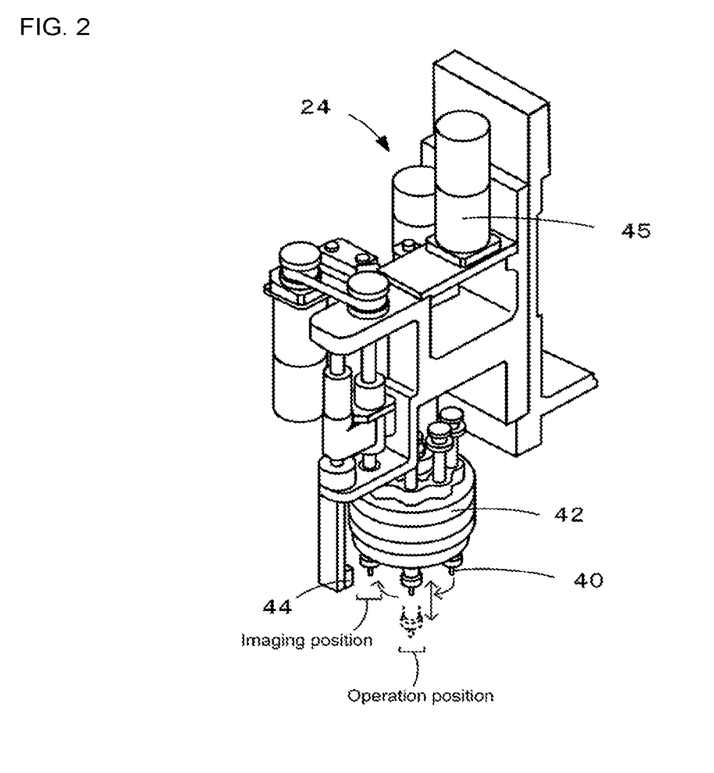
FIG. 2 shows mounting head 24.
Figure 3:
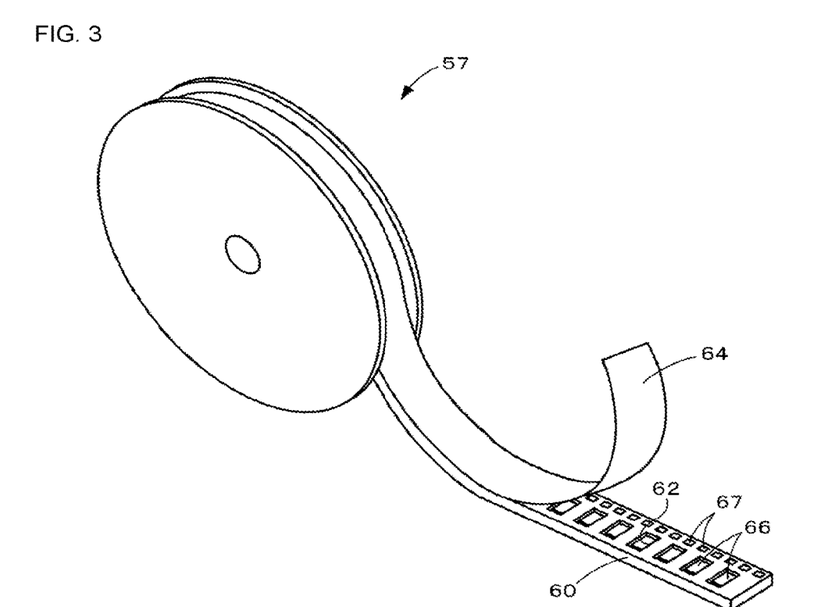
FIG. 3 shows reel 57.
Figure 4:
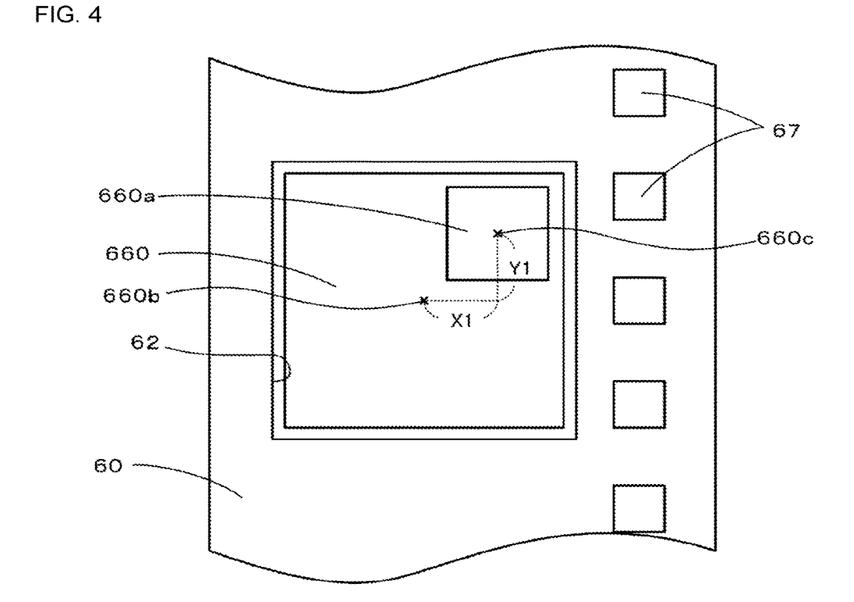
FIG. 4 shows light-emitting-section-equipped component 660.
Figure 5:
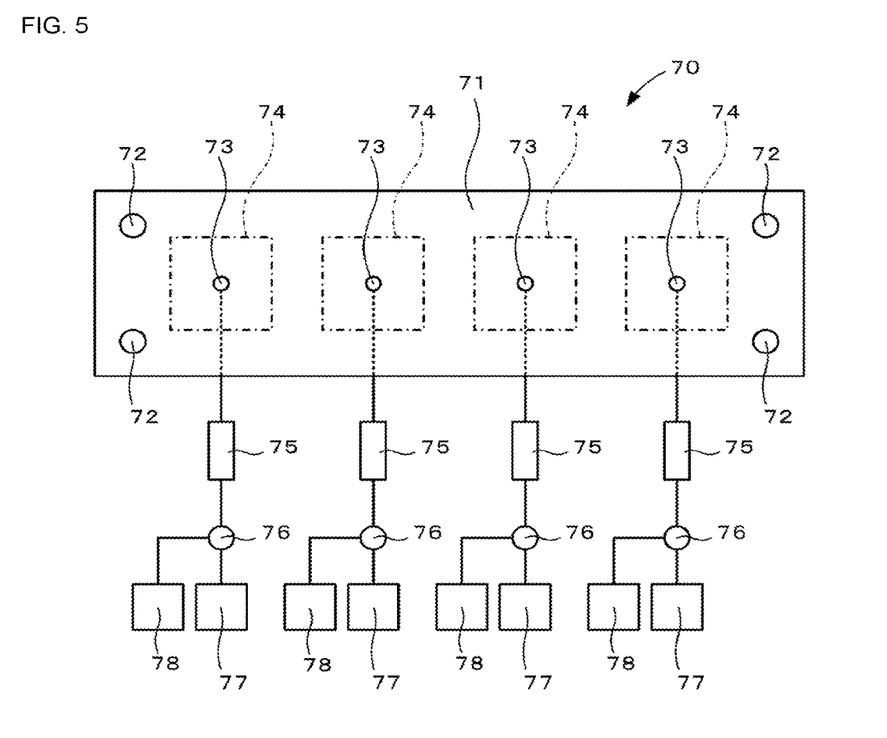
FIG. 5 is a plan view of temporary placement surface 71.

Hereinafter, an embodiment of the present disclosure will be described with reference to the figures. FIG. 1 shows mounting system 10, FIG. 2 shows mounting head 24, FIG. 3 shows reel 57, FIG. 4 shows light-emitting-section-equipped component 660, and FIG. 5 is a plan view of temporary placement surface 71. The present embodiment of mounting system 10 is provided with component mounter 11 that performs mounting processing of mounting components on board 12, and management computer 90 that performs settings and management of information related to the mounting processing. In the present embodiment, left-right directions (X axis), front-rear directions (Y axis), and up-down directions (Z axis) are set as shown in FIG. 1. Also, mounting processing includes processing such as arranging a component above a board, mounting, insertion, joining, and gluing.

As shown in FIG. 1, component mounter 11 is provided with conveyance section 18 that conveys board 12, collecting section 21 that performs mounting processing of collecting a component and arranging the component on board 12, mark camera 34 provided on collecting section 21, reel unit 56 that holds many reels 57, temporary placing stand 70 on which a component is temporarily placed, and control device 80 that performs overall device control of collection section 21, mark camera 34, and so on.

Conveyance section 18 is provided with support plates 20 and 20 arranged with a gap between them in the front-rear direction of FIG. 1 and extending in the left-right direction, and conveyor belts 22 and 22 provided on surfaces of both supporting plates 20 and 20 that face each other. Conveyor belts 22 and 22 are endlessly supported on drive wheels and driven wheels provided on the left and right of support plates 20 and 20. Board 21 is loaded on the upper surface of the pair of conveyor belts 22 and 22 and conveyed from left to right. Board 12 is supported from underneath by many support pins 23. Therefore, conveyance section 18 also performs the role of holding board 12.

Collecting section 21 is provided with mounting head 24, X-axis slider 26, and Y-axis slider 30. Mounting head 24 is attached to the front surface of X-axis slider 26. X-axis slider 26 is attached to the front surface of Y-axis slider 30, which is slidable in the front-rear direction, so as to be slidable in the left-right direction. Y-axis slider 30 is slidably attached to a pair of guide rails 32 and 32 that extend in the front-rear direction. Note that, guide rails 32 and 32 are fixed to an internal section of component mounter 11. Guide rails 28 and 28 that extend in the left-right direction are provided on the front surface of Y-axis slider 30, and X-axis slider 26 is attached to these guide rails 28 and 28 so as to be slidable in the left-right direction. Mounting head 24 moves in the left and right directions based on the moving in the left and right directions of X-axis slider 26, and moves in the front and rear directions based on the moving in the front and rear directions of Y-axis slider 30. Note that, each slider 26 and 30 is driven by a drive motor, which are not shown.

As shown in FIG. 2, mounting head 24 is provided with nozzles 40 that pick up and collect a component, and nozzle holding body 42 to which at least one nozzle 40 can be attached and removed. With the present embodiment, nozzle holding body 42 is provided with a total of four nozzle holders capable of holding a nozzle 40 provided at 90 degrees. Nozzle holding section 42 holds mounting head 24 so it is rotatable. Nozzle 40 uses pressure to pick up and release a component at the nozzle tip. Nozzle 40 is raised/lowered in the Z-axis direction (up/down direction), which is perpendicular to the X-axis and Y-axis directions, by a holder raising/lowering device that has Z-axis motor 45 as a drive source. The holder raising/lowering device raises and lowers only the single nozzle 40 that is currently stopped at the operation position (refer to FIG. 2). Thus, other nozzles 40 that are currently stopped at a position other than the operation position have a fixed vertical position. Nozzle 40 at the operation position is moved in a lowered position after picking up a component supplied from reel unit 56 to an upper position, and then, is rotated clockwise 90 degrees as shown in FIG. 2, and stops at an imaging position (refer to FIG. 2) positioned facing sideways camera 44. Sideways camera 44 is attached to mounting head 24 so as to be capable of imaging a component held by nozzle 40 at an imaging position, and outputs the captured image to control device 80.

Mark camera 34 images board 12 from above and is arranged on a lower surface of X-axis slider 26. The imaging region of mark camera 34 is below the camera, and mark camera images reference marks on board 12, and outputs the images to control device 80. Reference marks are used for grasping the position of board 12, or grasping the position of components on board 12. Mark camera 34 also images the top surface of component 66 temporarily placed on temporary placing stand and component 66 housed in tape 60, and outputs the images to control device 80. Mark camera 34 moves in the X and Y directions in accordance with the movement of mounting head 24.

Reel unit 56 holds reels 57 and feeders 58. Multiple reels 57 are removably attached to the front side of component mounter 11. As shown in FIG. 3, tape 60 housing components 66 in recessed housing sections 62 is wound around reel 57. The upper surface of tape 60 is covered by film 64 such that components 66 do not fall out of housing sections 62. Film 64 is peeled from tape 60 at a position before a specified collection position at which component 66 is picked up by nozzle 40. Also, tape 60 has multiple sprocket holes 67 provided in a lengthwise direction. A feeder 58 is provided for each reel 57. Feeder 58 is provided with a rotatable sprocket (not shown). The sprocket is rotated with the teeth of the sprocket engaged in sprocket holes 67 of tape 60 such that tape 60 is fed in a direction to be unwound from reel 57. Components 66 housed in housing sections 62 of tape 60 are sequentially fed to a specified collection position by feeder 58. Tape 60 is cut by a cutter (not shown) every specified length at a cutting position, which is after the collection position.

As shown in FIG. 4, at least one of the multiple reels 57 is wound around with tape 60 housing light-emitting-section-equipped component 660. Light-emitting-section-equipped component 660 includes LED 660a with a rectangular light-emitting section provided at a predetermined position on the upper surface. Specified pickup position 660b within the top surface of light-emitting-section-equipped component 660 at which the component is picked up by nozzle 40 is set with center position 660c of LED 660a as a reference. In the present embodiment, specified pickup position 660b is set as a position deviated X1 in the X direction and Y1 in the Y direction from center position 660c of LED 660a. Light-emitting-section-equipped component 660 is mounted on board 12 such that LED 660a is arranged on board 12 at a predetermined position.

Temporary placing stand 70 is a stand for temporarily placing light-emitting-section-equipped component 660 after light-emitting-section-equipped component 660 supplied by reel unit 56 has been picked up by nozzle 40 of mounting head 24 and before light-emitting-section-equipped component 660 is mounted on board 12 held by conveyance section 18. Temporary placing stand 70 is provided between conveyance section 18 that holds board 12 and reel unit 56 that holds reel 57. Also, the upper surface of temporary placing stand 70 is formed from temporary placement surface 71, which is finished to be flat with good accuracy. As shown in FIG. 5, temporary placement surface 71 includes temporary placing stand marks 72 at each of the four corners. These temporary placing stand marks 72 are used for recognizing the position of temporary placement surface 71. Also, four temporary placing areas 74 for loading component 66 are provided on temporary placement surface 71, with hole 73 provided at the center of each temporary placing area 74. Hole 73 is connected in series to vacuum pump 77 and air compressor 78 via switching valve 76, which is an electromagnetic valve. Thus, by adjusting switching value 76, it is possible to supply negative pressure or positive pressure to hole 73. Pressure sensor 75 that detects the pressure at hole 73 is provided between hole 73 and switching valve 76.

As shown in FIG. 1, control device 80 is configured from a microprocessor based around CPU 81, ROM 82 that memorizes a processing program, RAM 83 used as working memory, HDD 84 that memorizes various data, input/output interface 85 for performing communication of electric signals with external devices, and so on, and these are connected by bus 86. Control device 80 is connected to conveyance section 18, collecting section 21, mark camera 34, sideways camera 44, and reel unit 56, and so on such that two-way communication is possible, and receives image signals from mark camera 34 and sideways camera 44. Also, control device 80 outputs control signals to switching valve 76. Note that, position sensors, not shown, are provided on each slider 26 and 30, and control device 80 controls drive motors of each slider 26 and 30 while receiving an input of position information from those position sensors.

Management computer 90 is a PC that manages information related to component mounting processing, and is provided with input device 97 such as a mouse and keyboard, display device 98, and so on. An HDD, not shown, of management computer 90 memorizes production job data. Production job data includes information regarding in what order and in what position on which board the multiple components are to be mounted, information regarding how many of those boards mounted with such components are to be produced, and so on.

Next, operation of the embodiment of mounting system 10 configured as above is described. CPU 81 of control device 80 performs mounting of multiple components supplied by reel unit 56 onto board 12 using nozzle 40 based on the production job data. XYZ coordinates are set in component mounter 11 in advance. Component mounter 11 recognizes the position of X-axis slider 26, Y-axis slider 30, and Z-axis motor 45 using the XYZ coordinates. Also, CPU 81, before starting component mounting, images board marks of board 12 and temporary placing stand marks 72 of temporary placing stand 71 using mark camera 34, identifies coordinates of the board marks and temporary placing stand marks 72 based on the images, and recognizes accurately the position at which board 12 is actually held and the position at which temporary placement surface 71 is arranged.

Figure 6:
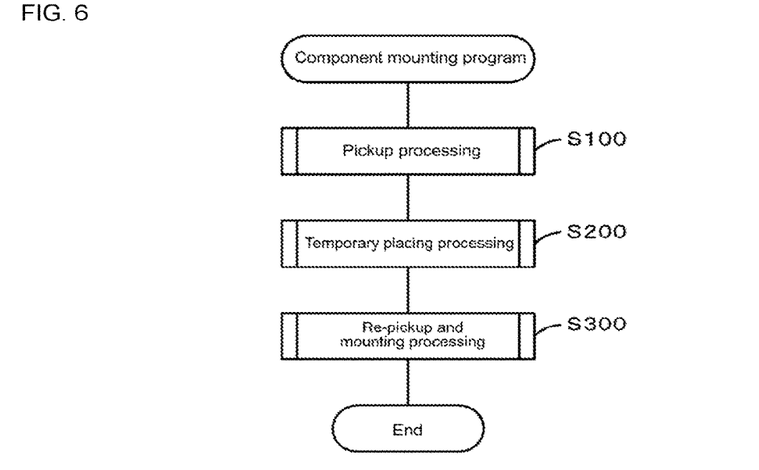
FIG. 6 is a flowchart of a component mounting program.

Procedures for performing mounting of light-emitting-section-equipped components 660 onto board 12 using four nozzles 40 of mounting head 24 are described in detail below with reference to the flowchart of the component mounting program shown in FIG. 6. This program is memorized on HDD 84 of component mounter 11.

When the component mounting program is started, CPU 81 of control device 80 performs a pickup processing routine (step S100), a temporary placing processing routine (step S200), and a re-pickup and mounting processing routine (step S300) in that order. Each routine is described below with reference to FIGS. 7 to 9.

Figure 7:
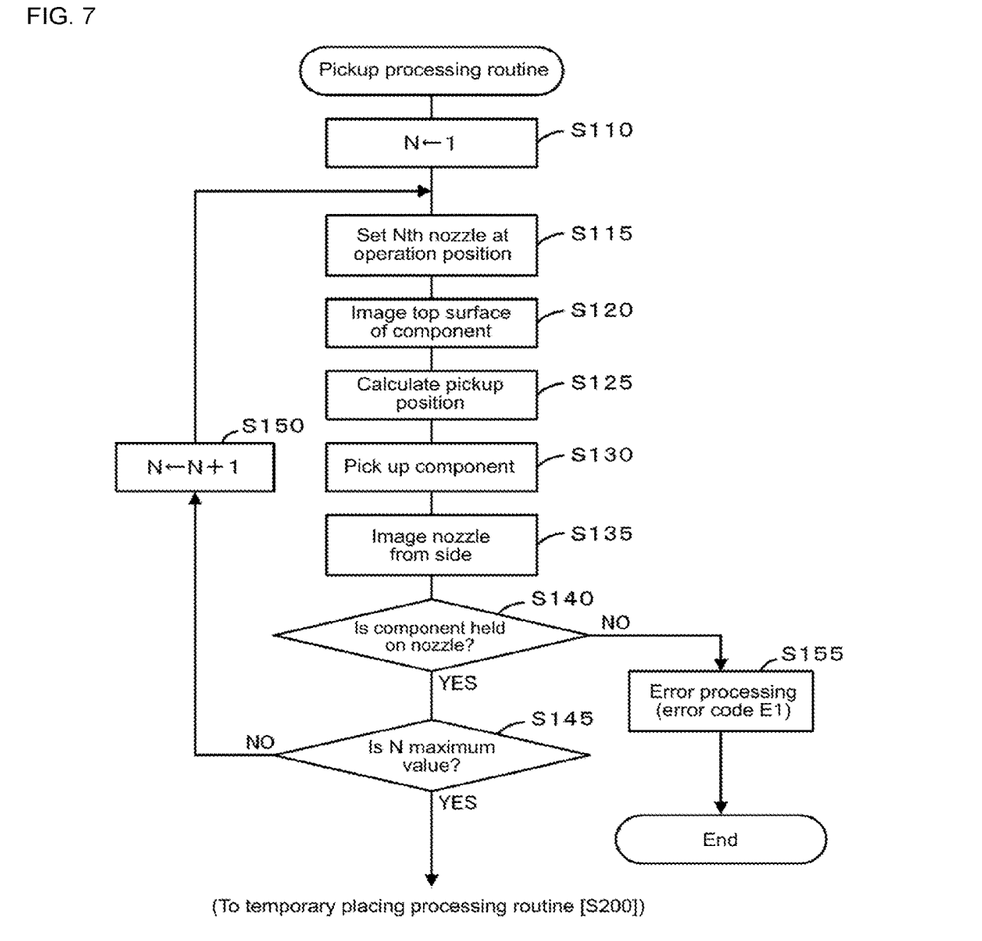
FIG. 7 is a flowchart of a pickup processing routine.
Figure 10:
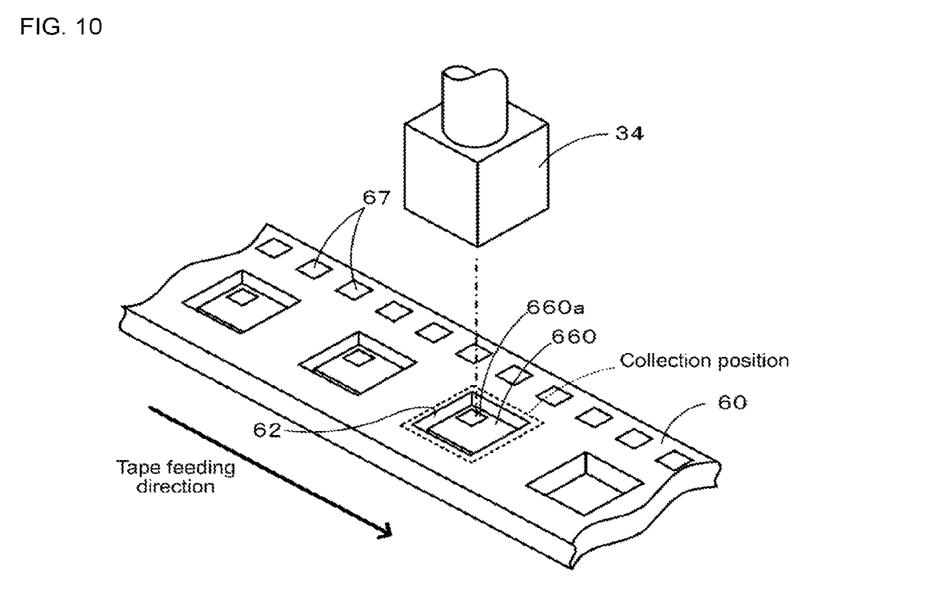
FIG. 10 shows the state when imaging light-emitting-region-equipped component 660 on tape 60.

When the pickup processing routine is started, CPU 81 first sets variable N of the counter of RAM 83 to one (step S110). Continuing, CPU 81 rotates mounting head 24 such that the Nth nozzle 40 is arranged at the operation position (step S115). Continuing, as shown in FIG. 10, CPU 81 images the top surface of light-emitting-section-equipped component 660 at the collection position using mark camera 34 (step S120). That is, CPU 81 controls X-axis slider 26 and Y-axis slider 30 such that mark camera 34 is above light-emitting-section-equipped component 660, then images the top surface of light-emitting-section-equipped component 660 including LED 660a using mark camera 34 at that position, and sends the image data to RAM 83. Continuing, CPU 81 calculates pickup position 660b of light-emitting-section-equipped component 660 (step S125). Here, CPU 81 calculates the outer border of light-emitting-section-equipped component 660 from the image data and the center position 660*c* of LED 660*a*, and from these calculates pickup position 660*b*. Note that, because the flatness of the bottom surface of housing section 62 of tape 60 is not good, light-emitting-section-equipped component 660 housed in housing section 62 is easily shifted. Thus, in many cases, the calculated pickup position 660*b* does not actually match the predetermined identified position.

Continuing, CPU 81 picks up light-emitting-section-equipped component 660 from tape 60 using Nth nozzle 40 (step S130). That is, CPU 81 controls X-axis slider 26 and Y-axis slider 30 such that Nth nozzle 40 is directly above pickup position 660*b* of light-emitting-section-equipped component 660, and then controls Z-axis motor 45 such that the tip of Nth nozzle 40 contacts pickup position 660*b*. In addition, CPU 81 supplies negative pressure to Nth nozzle 40 such that the nozzle 40 picks up light-emitting-section-equipped component 660. Then, CPU 81 controls Z-axis motor 45 such that Nth nozzle 40 is raised in the vertical direction. Continuing, CPU 81 images the area around the tip of Nth nozzle 40 using sideways camera 44 (step S135). That is, CPU 81 controls mounting head 24 such that Nth nozzle 40 is at the imaging position, images the area around the tip of Nth nozzle 40 using sideways camera 44 at that position, and sends the image data to RAM 83. Continuing, CPU 81 determines whether light-emitting-section-equipped component 660 is being held at the tip of Nth nozzle 40 (step S140).

Figure 8:
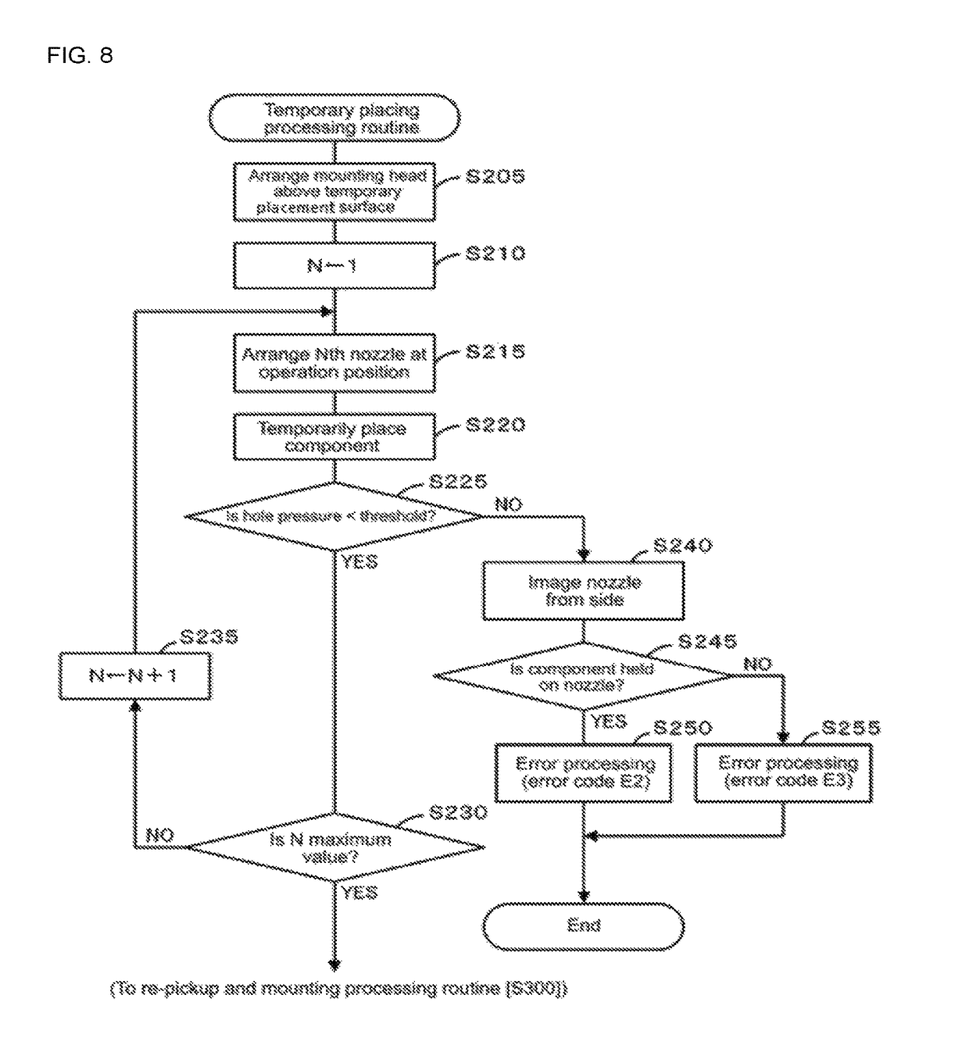
FIG. 8 is a flowchart of a temporary placing processing routine.

Then, if light-emitting-section-equipped component 660 is not being held at the tip of Nth nozzle 40, CPU 81 performs error processing including displaying error code E1 (step S155), and stops the component mounting program. In the error processing of step S155, CPU 81 displays error code E1 on a display, which is not shown in the figures, of component mounter 11, sounds an alarm, and causes a warning lamp to flash. Error code E1 indicates that pick up of component from tape 60 failed. Thus, an operator who sees error code E1 can easily know what is necessary work for clearing the error. On the other hand, if it is determined in step S140 that light-emitting-section-equipped component 660 is being held at the tip of Nth nozzle 40, CPU 81 determines whether variable N is at its maximum value (here, four) (step S145), and if variable N is not the maximum value, adds one to the value of variable N (step S150) and then returns to step S115. On the other hand, if variable N is at its maximum value in step S145, this means that a light-emitting-section-equipped component 660 is being held by all the nozzles 40, so processing continues to the temporary placing processing routine (step S200).

When the temporary placing processing routine is started, CPU 81 first controls X-axis slider 26 and Y-axis slider 30 such that mounting head 24 is above temporary placement surface 71 (step S205). Continuing, CPU 81 sets variable N of the counter of RAM 83 to one (step S210). Continuing, CPU 81 rotates mounting head 24 such that the Nth nozzle 40 is arranged at the operation position (step S215). Continuing, CPU 81 performs temporary placing operation for light-emitting-section-equipped component 660 (step S220). That is, CPU 81 controls X-axis slider 26 and Y-axis slider 30 such that light-emitting-section-equipped component 660 being held by Nth nozzle 40 is arranged above the Nth temporary placing area 74 of temporary placement surface 71. In the present embodiment, the four temporary placing areas 74 are allocated as first, second, etc. in order from the left. Then, CPU 81 lowers the Nth nozzle 40 so as to place the light-emitting-section-equipped component 660 on the Nth temporary placing area 74, and supplies positive pressure to Nth nozzle 40. In addition, CPU 81 controls switching valve 76 such that negative pressure is supplied to hole 73 of the Nth temporary placing area 74. Then, CPU 81 controls Z-axis motor 45 such that Nth nozzle 40 is raised in the vertical direction. Continuing, CPU 81 determines whether the pressure at hole 73 of Nth temporary placing area 74 is within a threshold value (step S225). Here, the threshold value is set such that the pressure value of hole 73 is within the threshold when the hole 73 to which negative pressure is being supplied is covered by light-emitting-section-equipped component 660, and such that the negative pressure of the hole is equal to or greater than the threshold when hole 73 is not covered by light-emitting-section-equipped component 660. Thus, a positive determination in step S225 indicates that light-emitting-section-equipped component 660 has been temporarily placed on temporary placing area 74 covering hole 73, and a negative determination in step S225 indicates that light-emitting-section-equipped component 660 has not been temporarily placed on temporary placing area 74.

Then, if the pressure of hole 73 of the Nth temporary placing area 74 was not less than the threshold in step S225, CPU 81 images the area around the tip of Nth nozzle 40 using sideways camera 44 (step S240). That is, CPU 81 controls mounting head 24 such that Nth nozzle 40 is arranged at the imaging position, images the area around the tip of Nth nozzle 40 using sideways camera 44 at that position, and sends the image data to RAM 83. Continuing, CPU 81 determines whether light-emitting-section-equipped component 660 is being held at the tip of Nth nozzle 40 (step S245).

Then, if light-emitting-section-equipped component 660 is being held at the tip of Nth nozzle 40, CPU 81 performs error processing including displaying error code E2 (step S250), and stops the component mounting program. In the error processing of step S250, CPU 81 displays error code E2 on a display, which is not shown in the figures, of component mounter 11, sounds an alarm, and causes a warning lamp to flash. Error code E2 indicates that temporary placing to temporary placing area 74 failed and that the component is still being held on nozzle 40. Thus, an operator who sees error code E2 can easily know that the component for which temporary placing failed is being held by nozzle 40. On the other hand, if light-emitting-section-equipped component 660 is not being held at the tip of Nth nozzle 40, CPU 81 performs error processing including displaying error code E3 (step S255), and stops the component mounting program. In the error processing of step S255, CPU 81 displays error code E3 on a display, which is not shown in the figures, of component mounter 11, sounds an alarm, and causes a warning lamp to flash. Error code E3 indicates that temporary placing to temporary placing area 74 failed and that the component is not being held on nozzle 40. Thus, an operator who sees error code E3 can easily suppose that the component fell around temporary placing stand 70 on the way from reel unit 56 to temporary placing stand 70.

Figure 9:
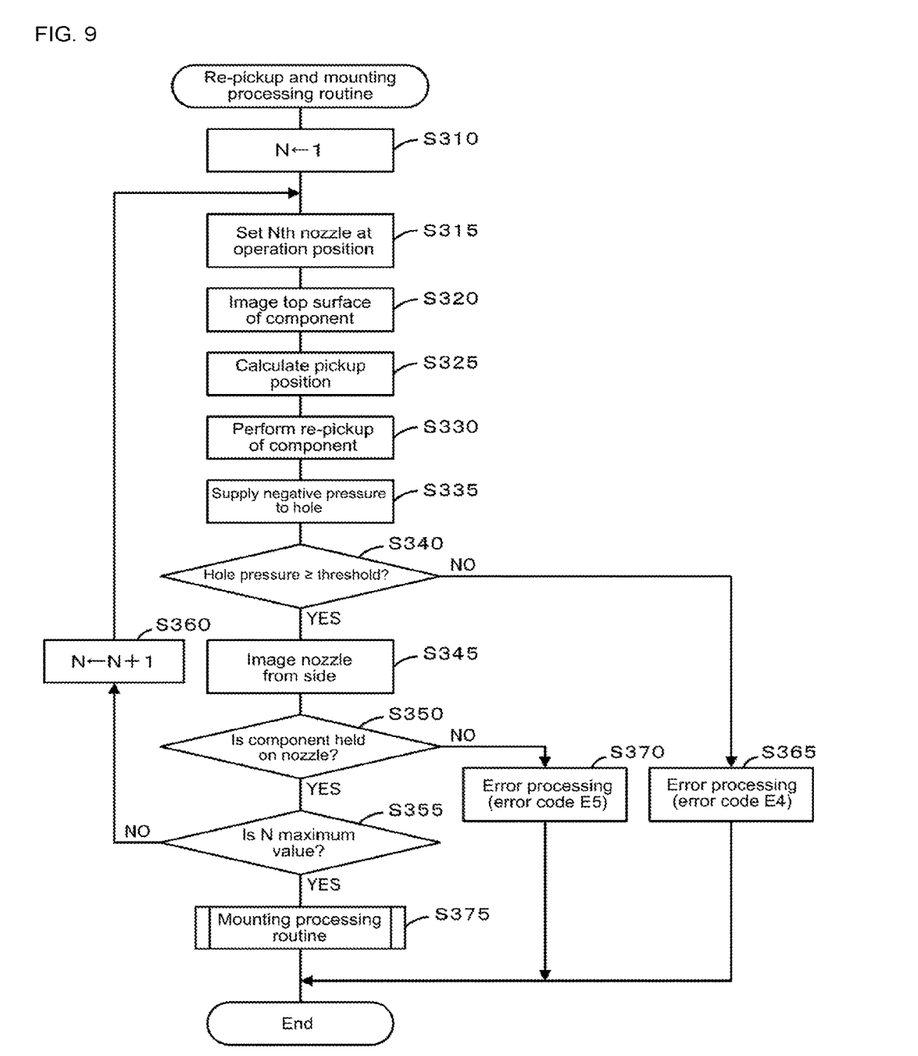
FIG. 9 is a flowchart of a processing routine for re-pickup and mounting.

On the other hand, if the pressure of hole 73 of Nth temporary placing area 74 is less than the threshold in step S225, CPU 81 determines whether variable is at its maximum value (step S230). Then, if variable is not at its maximum value, CPU 81 adds one to variable N (step S235) and returns to step S215. On the other hand, if variable N is at its maximum value in step S230, this means that a light-emitting-section-equipped component 660 has been temporarily placed at all temporary placing areas 74, so CPU 81 continues processing to the re-pickup and mounting processing routine (step S300).

Figure 11:
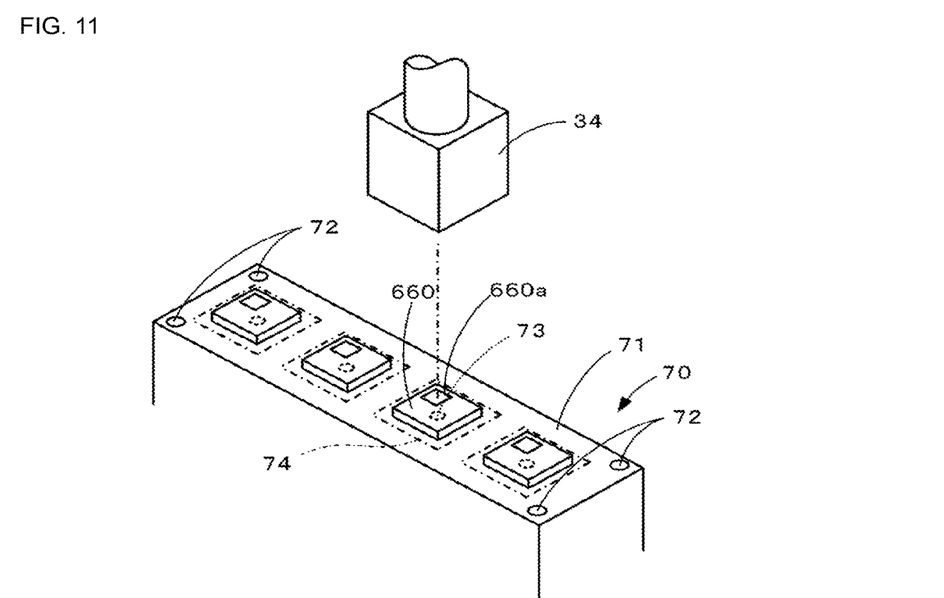
FIG. 11 shows the state when imaging light-emitting-section-equipped component 660 on temporary placement surface 71.

When the re-pickup and mounting processing routine is started, CPU 81 first sets variable N of the counter of RAM 83 to one (step S310). Continuing, CPU 81 arranges Nth nozzle 40 at the operation position (step S315). Continuing, as shown in FIG. 11, CPU 81 images the top surface of light-emitting-section-equipped component 660 temporarily placed at the Nth temporary placing area 74 using mark camera 34 (step S320). That is, CPU 81 controls X-axis slider 26 and Y-axis slider 30 such that mark camera 34 is above light-emitting-section-equipped component 660 temporarily placed at the Nth temporary placing area 74, then images the top surface of light-emitting-section-equipped component 660 including LED 660a using mark camera 34 at that position, and sends the image data to RAM 83. Continuing, CPU 81 calculates the pickup position of light-emitting-section-equipped component 660 (step S325). Here, CPU 81 calculates the outer border of light-emitting-section-equipped component 660 from the image data and the center position 660c of LED 660a, and from these calculates pickup position 660b. This processing is similar to step S125, but because the flatness of temporary placement surface 71 is good, light-emitting-section-equipped component 660 is held horizontally. Thus, the calculated pickup position 660 matches with good accuracy the predetermined identified position.

Continuing, CPU 81 picks up light-emitting-section-equipped component 660 temporarily placed at the Nth temporary placing area 74 again using Nth nozzle 40 (step S330). That is, CPU 81 controls X-axis slider 26 and Y-axis slider 30 such that Nth nozzle 40 is directly above pickup position 660b of light-emitting-section-equipped component 660 temporarily placed at the Nth temporary placing area 74, and then controls Z-axis motor 45 such that the tip of Nth nozzle 40 contacts pickup position 660b. In addition, CPU 81 supplies negative pressure to Nth nozzle 40 such that the nozzle 40 picks up light-emitting-section-equipped component 660. Here, CPU 81 also controls switching valve 76 such that positive pressure is supplied to hole 73 of the Nth temporary placing area 74. This makes it easier for light-emitting-section-equipped component 660 to separate from temporary placing area 74. Then, CPU 81 controls Z-axis motor 45 such that Nth nozzle 40 is raised in the vertical direction. Continuing, CPU 81 controls switching valve 76 such that negative pressure is supplied to hole 73 of the Nth temporary placing 74 (step S335) and determines whether the pressure of hole 73 is equal to or greater than a threshold (step S340). Here, the threshold may be set similar to the threshold of the above step S225.

Then, if the pressure of hole 73 of the Nth temporary placing area 74 is not equal to or greater than the threshold in step S340, CPU 81 performs error processing including displaying error code E4 (step S365), and stops the component mounting program. In the error processing of step S365, CPU 81 displays error code E4 on a display, which is not shown in the figures, of component mounter 11, sounds an alarm, and causes a warning lamp to flash. Error code E4 indicates that re-pickup from temporary placing area 74 failed and that the component is still at temporary placing area 74. Thus, an operator who sees error code E4 can easily know that the component for which re-pickup failed is still at temporary placing area 74.

On the other hand, if the pressure of hole 73 of the Nth temporary placing area 74 was equal to or greater than the threshold in step S340, CPU 81 images the area around the tip of Nth nozzle 40 using sideways camera 44 (step S345). That is, CPU 81 controls mounting head 24 such that Nth nozzle 40 is arranged at the imaging position, images the area around the tip of Nth nozzle 40 using sideways camera 44 at that position, and sends the image data to RAM 83. Continuing, CPU 81 determines whether light-emitting-section-equipped component 660 is being held at the tip of Nth nozzle 40 (step S350).

Then, if light-emitting-section-equipped component 660 is not being held at the tip of Nth nozzle 40, CPU 81 performs error processing including displaying error code E5 (step S370), and stops the component mounting program. In the error processing of step S370, CPU 81 displays error code E5 on a display, which is not shown in the figures, of component mounter 11, sounds an alarm, and causes a warning lamp to flash. Error code E5 indicates that nozzle 40 picked up the component from temporary placing area 74, but the component subsequently fell from the nozzle 40. Thus, an operator who sees error code E5 can easily know that the component is somewhere around temporary placement surface 71.

On the other hand, if it is determined in step S350 that light-emitting-section-equipped component 660 is being held at the tip of Nth nozzle 40, CPU 81 determines whether variable N is at its maximum value (here, four) (step S355), and if variable N is not the maximum value, adds one to the value of variable N (step S360) and then returns to step S315. On the other hand, if variable N is at its maximum value in step S145, this means that a light-emitting-section-equipped component 660 has been picked up again by all the nozzles 40, so processing continues to the mounting processing routine (step S375), and then the component mounting program ends. In the mounting processing routine, CPU 81 moves mounting head 24 above board 12, controls X-axis slider 26, Y-axis slider 30, and Z-axis motor 45, and controls the pressure of nozzles 40 such that LED 660a of each light-emitting-section-equipped component 660 is arranged as specified in the production job data.

Note that, in the case of an error, the component mounting program is restarted after an operator resolves the cause of the problem. By this, CPU restarts an interrupted component mounting program.

Correspondences between constituent elements of the present embodiment and constituent elements of the disclosure will be clarified here. In the present embodiment: reel unit 56 corresponds to the component supply device of the present disclosure; mounting head 24 corresponds to a component pickup device; X-axis slider 26, Y-axis slider 30, and Z-axis motor 45 correspond to a moving device; support plate 20 and support pins 23 correspond to a board holding device; switching valve 76, vacuum pump 77, and air compressor 78 correspond to a pressure adjustment device; pressure sensor 75 corresponds to a pressure detecting device; and control device 80 corresponds to a control device. Also, sideways camera 44 corresponds to a sideways imaging device, and mark camera 34 corresponds to a top surface imaging device.

According to the embodiment of component mounter 11 as described above, after performing control such that light-emitting-section-equipped component 660 is temporarily placed at temporary placing area 74 of temporary placement surface 71, it is determined whether the component has actually been temporarily placed at the specified position based on the pressure at hole 73 with negative pressure being supplied to the hole 73, and processing is performed according to the determination result. Because the determination of whether light-emitting-section-equipped component 660 has actually been temporarily placed is based on the pressure state of hole 73 provided in temporary placing area 74, the determination is performed rapidly compared to a case in which the presence of light-emitting-section-equipped component 660 is checked by analyzing an image of temporary placement surface 71 captured from above. Therefore, throughput is improved.

Also, in a case in which light-emitting-section-equipped component 660 is supplied from reel unit 56, light-emitting-section-equipped component 660 is supplied using tape 60, but in this case, because the flatness of tape 60 is not good, it is easy for the light-emitting-section-equipped component 660 to shift. Thus, when light-emitting-section-equipped component 660 supplied by reel unit 56 is picked up by nozzle 40 of mounting head 24, it is difficult to accurately pick up at pickup position 660b determined in advance. However, with the present embodiment, because temporary placement surface 71 is flat, when picking up light-emitting-section-equipped component 660 placed on temporary placement surface 71 again using nozzle 40 of mounting head 24, it is possible to accurately pick up at the identified pickup position 660b.

Further, in a case in which light-emitting-section-equipped component 660 has not actually been placed on temporary placement surface 71, because an operator is informed whether the light-emitting-section-equipped component 660 is being held as is on nozzle 40 via error codes E2 and E3, it is easy for the operator to search for the light-emitting-section-equipped component 660 that was not temporarily placed.

Also, CPU 81, after confirming that light-emitting-section-equipped component 660 has actually been temporarily placed at temporary placing area 74 of temporary placement surface 71, performs a re-pickup and mounting processing routine that includes imaging the top surface of the light-emitting-section-equipped component 660. Thus, it is possible to avoid unnecessarily performing this re-pickup and mounting processing routine in a case in which light-emitting-section-equipped component 660 has not actually been temporarily placed.

Further, CPU 81, in a case in which light-emitting-section-equipped component 660 is picked up again by nozzle 40 of mounting head 24, controls switching valve 76 such that the pressure of hole 73 is positive pressure. Thus, it is possible for nozzle 40 to smoothly pick up light-emitting-section-equipped component 660 again.

Meanwhile, it goes without saying that the disclosure is not limited to the above-mentioned embodiment and various embodiments may be applied within the technical scope of the disclosure.

For example, in the temporary placing routine (refer to FIG. 8) of the present embodiment, CPU 81, if there is not a negative determination in step S225, instead of performing steps S240 to S255, may simply display an error indicating that temporary placing failed. In this case, error processing is performed without performing image analysis, so failure to temporarily place can be rapidly reported to an operator, thus greatly improving throughput.

In the above embodiment, mounting head 24 is provided with four nozzles 40, but there may be any quantity of nozzles 40. For example, mounting head may be provided with one nozzle 40, eight nozzles 40, or twelve nozzles 40. Also, in a case in which mounting head 24 provided with, for example, eight nozzles 40 is used with a temporary placement surface 71 on which four temporary placing areas 74 are provided as in the above embodiment, operation may be performed using only four of the eight nozzles 40.

In the above embodiment, vacuum pump 77 and air compressor 78 are provided for each of the four holes 73 of temporary placement surface 71, but this may be reduced to only one vacuum pump 77 and one air compressor 78 in total.

In the above embodiment, air compressor 78 is connected to the four holes 73 of temporary placement surface 71, but air compressor 78 may be omitted and the connection be to the atmosphere. In this case, instead of positive pressure being supplied to hole 73, atmospheric pressure would be supplied.

In the above embodiment, light-emitting-section-equipped component 660 with LED 660a on the top surface is given as an example, and a specified pickup position 660b is calculated from the center position 660c of LED 660a, but a different marker on the top surface may be used instead of LED 660a. For example, for a component with polarity such as a diode or a capacitor, a mark indicating the direction of the polarity (for example, a "+") may be provided on the top surface of the component, and the specified pickup position may be calculated from the position of that mark.

In step S250 of the temporary placing processing routine of the above embodiment, CPU 81 performs error processing including displaying error code E2; however, because light-emitting-section-equipped component 660 is being held by nozzle 40, processing may return to step S220 such that operation to temporarily place the component is performed again.

In the above embodiment, reel unit 56 is given as an example of a component supply device, but a tray unit may be used instead of reel unit 56.

In the above embodiment, when picking up a light-emitting-section-equipped component 660 temporarily placed at temporary placing area 74 again, pickup is performed at pickup position 660b identified in advance, but pickup may be performed at a predetermined design value (coordinate position) without using an identified pickup position 660b. In this case too, it is possible to mount light-emitting-section-equipped component 660 such that LED 660a is arranged at a specified position on board 12.

INDUSTRIAL APPLICABILITY

The present disclosure may be applied to a component mounter that mounts electronic components on a board.

REFERENCE SIGNS LIST

10: mounting system; 11: component mounter; 12: board; 18: conveyance section; 20: support plate; 21: collecting section; 22: conveyor belt; 23: support pin; 24: mounting head; 26: X-axis slider; 28: guide rail; 30: Y-axis slider; 32: guide rail; 34: mark camera; 40: nozzle; 42: nozzle holding body; 44: sideways camera; 45: Z-axis motor; 56: reel unit; 57: reel; 58: feeder; 60: tape; 62: housing section; 64: film; 66: component; 67: sprocket hole; 70: temporary placing stand; 71: temporary placement surface; 72: temporary placing stand mark; 73: pressure hole; 74: temporary placing area; 75: pressure sensor; 76: switching valve; 77: vacuum pump; 78: air compressor; 80: control device; 81: CPU; 82: ROM; 83: RAM; 84: HDD; 85: input/output interface; 86: bus; 90: management computer; 97: input device; 98: display; 660: light-emitting-section-equipped component; 660a: LED; 660b: pickup position; 660c: center position

The invention claimed is:

1. A component mounter comprising:
   a component supply device configured to supply a component;
   a component pickup device configured to pick up the component;
   a moving device configured to move the component pickup device;
   a board holding device configured to hold a board on which the component is to be mounted;
   a temporary placement surface having a hole at a specified position, the component being temporarily placed at the specified position;
   a pressure adjustment device configured to supply at least negative pressure to the hole;
   a pressure detecting device configured to detect pressure at the hole; and
   a control device configured to control the component pickup device and the moving device such that after the component supplied by the component supply device has been picked up by the component pickup device and before the component is mounted on the board, the component is temporarily placed at the specified position, wherein
   the control device, after performing control to temporarily place the component at the specified position, determines whether the component has actually been temporarily placed at the specified position based on the pressure state of the hole with negative pressure being supplied to the hole, and performs processing based on the determination result.

2. The mounter according to claim 1, wherein the temporary placement surface is a flat surface.

3. The component mounter according to claim 1, further comprising:
   a sideways imaging device configured to image the component picked up by the component pickup device from a side,
   wherein
   the control device, if the determination result is negative, images the component pickup device using the sideways imaging device, determines whether the component pickup device is holding the component based on the image, reports the determination result to an operator, and stops processing.

4. The component mounter according to claim 1, further comprising:
   a top surface imaging device configured to image a top surface of the component temporarily placed on the temporary placement surface, wherein
   the control device, if the determination is positive, performs processing to image the top surface of the component placed on the temporary placement surface using the top surface imaging device, identify a position of the component based on the image, control the component pickup device to pick up the component again, and control the component pickup device and the moving device such that the component is mounted on the board based on the identified position of the component, and, if the determination is negative, the control device stops processing.

5. The component mounter according to claim 4, wherein the control device, in a case in which the component was picked up again by the component pickup device, controls the pressure adjustment device such that the pressure in the hole becomes atmospheric pressure or positive surface.

6. The component mounter according to claim 4, wherein the control device, after controlling the component pickup device to pick up the component again, performs a second determination of whether the component was actually picked up by the component pickup device based on the pressure state of the hole with negative pressure being supplied to the hole, and continues processing if the second determination is positive, and stops processing if the second determination is negative.

* * * * *